United States Patent

Ebrahimzad et al.

(10) Patent No.: US 11,791,844 B2
(45) Date of Patent: Oct. 17, 2023

(54) SYSTEMS AND METHODS FOR USING SPECIAL NODES FOR POLAR ENCODING IN POLAR CODES

(71) Applicants: Hamid Ebrahimzad, Kanata (CA); Zhuhong Zhang, Ottawa (CA)

(72) Inventors: Hamid Ebrahimzad, Kanata (CA); Zhuhong Zhang, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/559,262

(22) Filed: Dec. 22, 2021

(65) Prior Publication Data

US 2023/0198551 A1 Jun. 22, 2023

(51) Int. Cl.
*H03M 13/00* (2006.01)
*H03M 13/13* (2006.01)

(52) U.S. Cl.
CPC .................................. *H03M 13/13* (2013.01)

(58) Field of Classification Search
CPC ...................................................... H03M 13/13
See application file for complete search history.

(56) References Cited

U.S. PATENT DOCUMENTS

| | | | | |
|---|---|---|---|---|
| 8,913,686 B2* | 12/2014 | Barron | ................. | H03M 13/611 375/147 |
| 9,164,835 B2* | 10/2015 | Lee | ..................... | G06F 11/1072 |
| 9,191,044 B1* | 11/2015 | Sun | ......................... | H04B 1/10 |
| 9,319,070 B2* | 4/2016 | Li | ........................... | H04L 9/0858 |
| 9,503,126 B2* | 11/2016 | Vardy | .................... | H03M 13/13 |
| 9,819,361 B2* | 11/2017 | Shin | ..................... | H03M 13/134 |
| 9,941,906 B2* | 4/2018 | Hof | .................... | H03M 13/6516 |
| 10,491,326 B2* | 11/2019 | Zhang | ................... | H03M 13/13 |
| 10,833,706 B2* | 11/2020 | Kim | ....................... | H03M 13/13 |
| 11,349,598 B2* | 5/2022 | Hui | ........................ | H04L 1/0041 |

(Continued)

FOREIGN PATENT DOCUMENTS

| | | | |
|---|---|---|---|
| CN | 106877884 A | | 6/2017 |
| CN | 109194338 A | | 1/2019 |

(Continued)

OTHER PUBLICATIONS

E. Arikan, "Channel polarization: A method for constructing capacity achieving codes for symmetric binary-input memoryless channels," IEEE Trans. Inf. Theory, vol. 55, pp. 3051-3073, Jul. 2009.

(Continued)

*Primary Examiner* — Esaw T Abraham

(57) ABSTRACT

Methods and encoders for encoding information bits to generate codewords for transmission across a communication channel are described. The method includes receiving input data comprising bits of information bits and frozen bits. Each bit has a value. Further, the method identifies at least one special arrangement in a subset of input data depending on locations of the information bits and the frozen bits. This subset of input data is of length L. The subset of input data has at least one special arrangement that enables direct computations instead of a series of computations to determine a preliminary output. The method generates a codeword for the input data from the preliminary output.

14 Claims, 8 Drawing Sheets

(56) References Cited

U.S. PATENT DOCUMENTS

2019/0229752 A1    7/2019  Saber et al.

FOREIGN PATENT DOCUMENTS

CN    111614362 A    9/2020
WO    2018161762 A1    9/2018

OTHER PUBLICATIONS

Tal and A. Vardy, "List decoding of polar codes", IEEE Trans. IT, vol. 61, No. 5, pp. 2213-2226, Mar. 2015.
M. El-Khamy, H. Mahadavifar, G. Feygin, J. Lee and I. Kang, "Relaxed polar codes", IEEE Trans. IT, vol. 63, No. 4, pp. 1986-2000, Apr. 2017.
T Kolie-Akino, et. Irregular Polar Coding for Complexity-Constrained Lightwave Systems, Journal of lightwave tech, vol. 36. No. 11, 2018.
G. Sarkis, P. Giard, A. Vardy, C. Thibeault, and W. Gross, Fast polar decoders: Algorithm and implementation, IEEE J. Sel. Areas Commun. ,vol. 32, No. 5, pp. 946-957, May 2014.
M. Hanif, M. Ardakani, Fast successive-cancellation decoding of polar codes: Identification and decoding of new nodes, IEEE Commun. Lett., vol. 21, No. 11, pp. 2360-2363, Nov. 2017.
S. A. Hashemi, C. Condo, and W. J. Gross, "Simplified successive cancellation list decoding of polar codes," in IEEE Int. Symp. on Inform. Theory, Jul. 2016, pp. 815-819.
H. Mahdavifar, M. Ek-Khamy, J. Lee and I Kang, "Polar Coding for Bit-Interleaved Coded Modulation" in IEEE Transactions on Vehicular Tech., May 5, 2016.

\* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

300

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

302

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

SYSTEMS AND METHODS FOR USING SPECIAL NODES FOR POLAR ENCODING IN POLAR CODES

FIELD OF THE INVENTION

The present disclosure generally relates to the field of encoding information for transmission over a noisy medium, particularly to systems and methods for using special nodes for polar encoding in polar codes to reduce power consumption.

BACKGROUND

In a data communication system, information bits (data) are transmitted over a channel from a transmitter to a receiver. The information bits are subject to degradation due to noise in the channel; hence, the information bits received may not be identical to the information bits transmitted. Furthermore, the implementation of the transmitter and receiver depends upon the channel over which the information bits are to be transmitted, e.g., whether the channel is wireless, a cable, or an optical fiber.

Forward error correction codes (FECs) provide reliable communication in a channel by enabling a receiver to detect and correct a limited number of errors. Forward Error Correction (FEC) techniques may be used to reduce bit error rate (BER). For example, a message may be transmitted using FEC-encoded bits, which include redundant information, such as parity or check bits. The bit estimates recovered at the receiver are estimates of the FEC-encoded bits generated at the transmitter. These estimates may undergo FEC decoding at the receiver based on a chosen FEC scheme. The FEC decoding uses the redundant information included in the FEC-encoded bits to detect and correct bit errors. Ultimately, estimates of the original message bits may be recovered from the FEC-decoded bit estimates.

Two basic types of FECs are block FECs and convolution FECs. Block FECs split the data into blocks, each is independently encoded (i.e., independently of other blocks) prior to transmission. In convolutional FECs, the encoded information bits depend on both the current and previous information bits.

FECs are important in data transmission systems. For example, in high-throughput optical transmission systems, it is not uncommon for forward error correction to consume more than half of the power in optical digital processing (oDSP). It is, therefore, desirable to design FECs with high coding gain, low latency and low power consumption.

There are many techniques for designing FECs, and many types of FECs are known in the art (e.g., algebraic code, convolutional turbo code, low-density parity-check (LDPC) code, turbo product codes (TPC), etc.). In 2009, Arikan introduced a kind of block FEC known as "polar codes," in E. Arikan, "Channel Polarization: A Method for Constructing Capacity Achieving Codes for Symmetric Binary-Input Memoryless Channels," *IEEE Trans. Inf. Theory*, vol. 55, no. 7, pp. 3051-3073 (July 2009). A polar code is a linear block code that "polarizes" the capacity of bit channels. That is, after being polarized by the polar block code, the bit channels polarize such that their capacities either approach one (i.e., a perfect channel) or zero (a completely noisy channel). Information bits are then sent through the bit channels that have capacities near one, while predetermined (e.g., constant) bit values are sent over bit channels that have a capacity near zero (these are referred to as "frozen" bits, since their values do not vary). Although the data communication system receives information bits, the encoder of the data communication system receives input data. The input data comprises the information bits and frozen bits. The data communication system adds the frozen bits to be sent through the channel bits with a capacity near zero. Arikan was able to show that, as the code length (i.e., the number of bit channels) approaches infinity, the number of bit channels with a capacity of one, divided by the total number of bit channels, approaches the channel capacity—i.e., the theoretical maximum data rate for the channel (also known as the "Shannon capacity").

The polar code encoding algorithm proposed by Arikan includes generating polar codes for the input data by multiplying values of the input data by a generator matrix. The input data undergoing encoding can be effectively represented as a binary tree. This encoding method requires a multitude of operations and consumes a significant amount of power.

Polar codes are the first and, at present, the only class of codes that have been analytically proven to be able to achieve channel capacity within an implementable complexity. While polar codes have this theoretical advantage over other known FECs, many challenges remain in terms of practical implementation. Therefore, it would be desirable to develop encoding methods of polar coding techniques that perform fewer computations and consume less power than the original encoder proposed by Arikan.

SUMMARY

The present disclosure provides an encoding method and system that uses the concept of special nodes for encoding values of input data. Using special nodes for encoding improves the number of computations required compared to the original polar code proposed by Arikan. The disclosed technology may, therefore, be seen as improving the reliability and throughput of digital communications.

In accordance with one aspect of the present disclosure, the technology is implemented as a method for encoding information bits to generate codewords for transmission across a communication channel. The method includes receiving input data comprising bits of information bits and frozen bits. Each bit has value. Further, the method identifies at least one special arrangement in a subset of input data depending on locations of the information bits and the frozen bits. This subset of input data is of length L. This subset of input data has at least one special arrangement that enable direct computations instead of a series of computations to determine a preliminary output. The method further generates a codeword for the input data from the preliminary output.

In some embodiments, the method further comprises representing the input data as a tree such that each two or more leaves of the tree are connected by a node. A subset of the nodes are special nodes. These special nodes indicate that the respective subset of input data of the node has the at least one special arrangement.

In some embodiments, the at least one special arrangement of the subset of input data is one of:
  Rate 0: wherein all bits of the subset of input data are frozen bits;
  Rate 1: wherein all bits of the subset of input data are information bits; SPC: wherein a most-left bit of the subset of input data is a frozen bit and the other bits of the subset of input data are information bits;

Type I: wherein two right-most bits of the subset of input data are information bits and the other bits of the subset of input data are frozen bits;

Type II: wherein three right-most bits of the subset of input data are information bits and the other bits of the subset of input data are frozen bits; and Type III: wherein two most-left bits of the subset of input data are frozen bits and the other bits of the subset of input data are information bits.

In some embodiments, in response to determining that one of the special nodes is Rate 0, the preliminary output of the special node comprises L bits of zero values;

Rate 1, the preliminary output of the special node comprises L number of bits of information bits;

SPC, the preliminary output of the special node comprises L number of bits, L−1 bits of the L bits being information bits and one bit being an XOR operation of the L−1 bits of the information bits;

Type I, the preliminary output of the special node comprises L number of bits, the L bits being two information bits repeated alternatively;

Type II, the preliminary output of the special node comprises L number of bits. The bits are three information bits repeated. Every repetition is a first information bit, a second information bit, a third information bit, and a module 2 addition of the first information bit, the second information bit, and the third information bit; and Type III, the preliminary output of the special node comprises L number of bits, wherein L−2 bits are information bits, the L−2 bits that are information bits being divided into two groups and a parity check bit being computed for each group, wherein the two parity check bits are two other bits of the L bits.

In some embodiments, the series of computations involves computing a value for each node by multiplying values of each node's leaves by a generator matrix.

In some embodiments, the generator matrix is $G_2^{\otimes \log_2 L}$, provided that $$G_2 = \begin{bmatrix} 1 & 0 \\ 1 & 1 \end{bmatrix}.$$

In some embodiments, in response to determining that one of the special nodes has an ancestor node which is also another special node, the preliminary output is determined for the another special node only.

In some embodiments, in response to determining that bits of the subset of input data do not have the at least one special arrangement, the series of computations are performed to determine the preliminary output.

In some embodiments, generating the codeword comprises combining the preliminary output with the series of computations from subsets of input data that do not have the at least one special arrangement.

In some embodiments, the frozen bits have a value of zero.

In accordance with one aspect of the present disclosure, the technology is implemented as an encoder that encodes information bits to generate codewords for transmission across a communication channel. The encoder comprises circuitry configured to receive input data comprising bits of information bits and frozen bits. Each bit has value. Further, the encoder identifies at least one special arrangement in a subset of input data depending on locations of the information bits and the frozen bits. This subset of input data is of length L. This subset of input data has at least one special arrangement that enable direct computations instead of a series of computations to determine a preliminary output. The encoder further generates a codeword for the input data from the preliminary output.

In some embodiments, the encoder further comprises representing the input data as a tree. Such that each two or more leaves of the tree are connected by a node. A subset of the nodes are special nodes. These special nodes indicate that the respective subset of input data of the node has the at least one special arrangement.

In some embodiments, the at least one special arrangement of the subset of input data is one of:

Rate 0: wherein all bits of the subset of input data are frozen bits;

Rate 1: wherein all bits of the subset of input data are information bits; SPC: wherein a most-left bit of the subset of input data is a frozen bit and the other bits of the subset of input data are information bits;

Type I: wherein two right-most bits of the subset of input data are information bits and the other bits of the subset of input data are frozen bits;

Type II: wherein three right-most bits of the subset of input data are information bits and the other bits of the subset of input data are frozen bits; and Type III: wherein two most-left bits of the subset of input data are frozen bits and the other bits of the subset of input data are information bits.

In some embodiments, wherein in response to determining that one of the special nodes is:

Rate 0, the preliminary output of the special node comprises L bits of zero values;

Rate 1, the preliminary output of the special node comprises L number of bits of information bits;

SPC, the preliminary output of the special node comprises L number of bits, L−1 bits of the L bits being information bits and one bit being an XOR operation of the L−1 bits of the information bits;

Type I, the preliminary output of the special node comprises L number of bits, the L bits being two information bits repeated alternatively;

Type II, the preliminary output of the special node comprises L number of bits. The bits are three information bits repeated. Every repetition is a first information bit, a second information bit, a third information bit, and a module 2 addition of the first information bit, the second information bit, and the third information bit; and Type III, the preliminary output of the special node comprises L number of bits, wherein L−2 bits are information bits, the L−2 bits that are information bits being divided into two groups and a parity check bit being computed for each group, wherein the two parity check bits are two other bits of the L bits.

In some embodiments, the series of computations involves computing a value for each node by multiplying values of each node's leaves by a generator matrix.

In some embodiments, the generator matrix is $G_2^{\otimes \log_2 L}$, provided that $$G_2 = \begin{bmatrix} 1 & 0 \\ 1 & 1 \end{bmatrix}.$$

In some embodiments, in response to determining that one of the special nodes has an ancestor node which is also another special node, the preliminary output is determined for the another special node only.

In some embodiments, in response to determining that bits of the subset of input data do not have the at least one special arrangement, the series of computations are performed to determine the preliminary output.

In some embodiments, generating the codeword comprises combining the preliminary output with the series of computations from subsets of input data that do not have the at least one special arrangement.

In some embodiments, the frozen bits have a value of zero.

BRIEF DESCRIPTION OF THE FIGURES

The features and advantages of the present disclosure will become apparent from the following detailed description, taken in combination with the appended drawings, in which:

FIG. 3 illustrates how a polar coding generator matrix may be produced from a kernel in accordance with some example embodiments.

Figure 1:
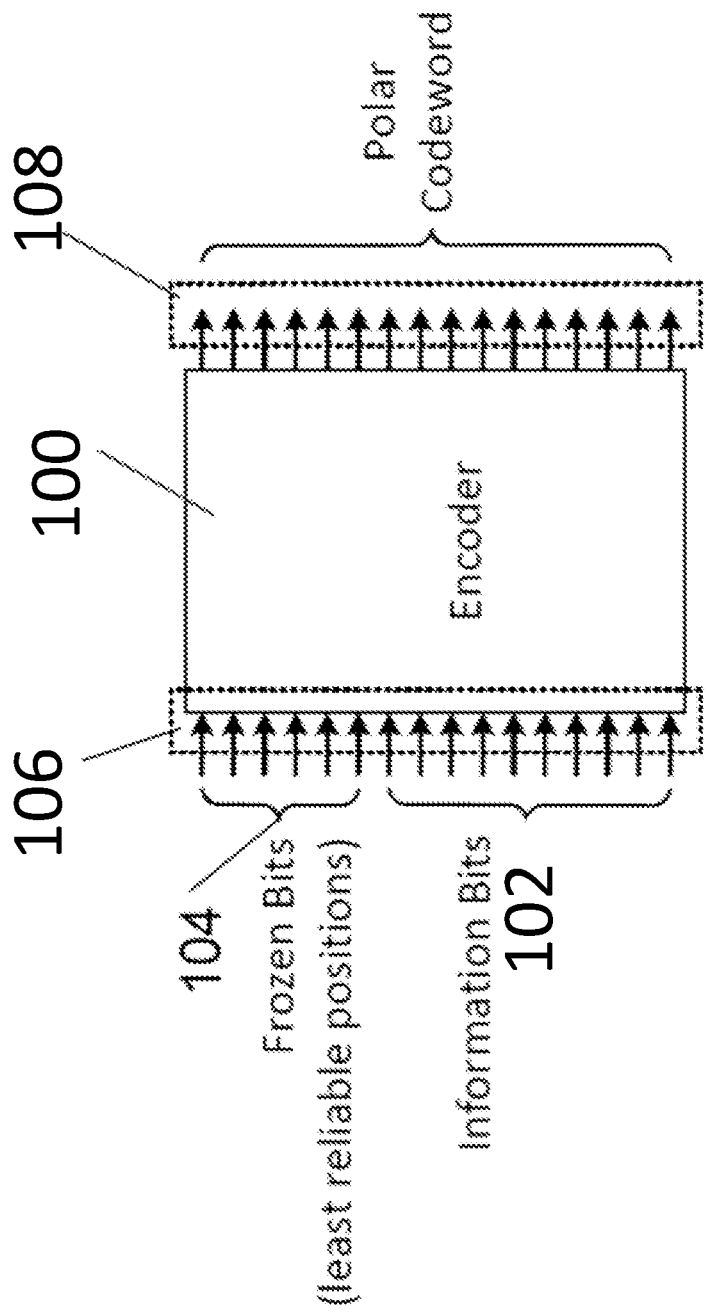
FIG. 1 shows an encoder for a polar code which may be used for polar encoding in accordance with some example embodiments.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Various representative embodiments of the disclosed technology will be described more fully hereinafter with reference to the accompanying drawings. However, the present technology may be embodied in many different forms and should not be construed as limited to the representative embodiments set forth herein. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The functions of the various elements shown in the figures, including any functional block labeled as a "processor," may be provided through the use of dedicated hardware as well as hardware capable of executing instructions in association with appropriate software instructions. When provided by a processor, the functions may be provided by a single dedicated processor, by a single shared processor, or by a plurality of individual processors, some of which may be shared. In some implementations of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, an application-specific integrated circuit (ASIC), a field-programmable gate array (FPGA), a read-only memory (ROM) for storing software, a random access memory (RAM), and non-volatile storage. Other hardware, conventional and/or custom, may also be included.

Software modules, or simply modules or units which are implied to be software, may be represented herein as any combination of flowchart elements or other elements indicating the performance of process steps and/or textual description. Such modules may be executed by hardware that is expressly or implicitly shown. Moreover, it should be understood that a module may include, for example, but without limitation, computer program logic, computer program instructions, software, stack, firmware, hardware circuitry, or a combination thereof, which provides the required capabilities. It will further be understood that a "module" generally defines a logical grouping or organization of related software code or other elements, as discussed above, associated with a defined function. Thus, one of ordinary skill in the relevant arts will understand that particular code or elements that are described as being part of a "module" may be placed in other modules in some implementations, depending on the logical organization of the software code or other elements, and that such modifications are within the scope of the disclosure as defined by the claims.

It should also be noted that as used herein, the term "optimize" means to improve. It is not used to convey that the technology produces the objectively "best" solution, but rather that an improved solution is produced. In the context of memory access, it typically means that the efficiency or speed of memory access may be improved.

As used herein, the term "determine" generally means to make a direct or indirect calculation, computation, decision, finding, measurement, or detection. In some cases, such a determination may be approximate. Thus, determining a value indicates that the value or an approximation of the value is directly or indirectly calculated, computed, decided upon, found, measured, detected, etc. If an item is "predetermined" it is determined at any time prior to the instant at which it is indicated to be "predetermined."

The present technology may be implemented as a system, a method, and/or a computer program product. The computer program product may include a computer-readable storage medium (or media) storing computer-readable program instructions that, when executed by a processor, cause the processor to carry out aspects of the disclosed technology. The computer-readable storage medium may be, for example, an electronic storage device, a magnetic storage device, an optical storage device, an electromagnetic storage device, a semiconductor storage device, or any suitable combination of these. A non-exhaustive list of more specific examples of the computer-readable storage medium includes a portable computer disk, a hard disk, a random access memory (RAM), a read-only memory (ROM), a flash memory, an optical disk, a memory stick, a floppy disk, a mechanically or visually encoded medium (e.g., a punch card or bar code), and/or any combination of these. A computer-readable storage medium, as used herein, is to be construed as being a non-transitory computer-readable medium. It is not to be construed as being a transitory signal, such as radio waves or other freely propagating electromagnetic waves, electromagnetic waves propagating through a waveguide or other transmission media (e.g., light pulses passing through a fiber-optic cable), or electrical signals transmitted through a wire.

It will be understood that computer-readable program instructions can be downloaded to respective computing or processing devices from a computer-readable storage medium or to an external computer or external storage device via a network, for example, the Internet, a local area network, a wide area network and/or a wireless network. A network interface in each computing/processing device may receive computer-readable program instructions via the network and forwards the computer-readable program instructions for storage in a computer-readable storage medium within the respective computing or processing device. Computer-readable program instructions for carrying out operations of the present disclosure may be assembler instructions, machine instructions, firmware instructions, configuration data for integrated circuitry, or either source code or object code written in any combination of one or more programming languages.

All statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in computer-readable program instructions. These computer-readable program instructions may be provided to a processor or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowcharts, flow diagrams, state transition diagrams, pseudo-code, and the like.

The computer-readable program instructions may also be loaded onto a computer, other programmable data processing apparatus or other devices to cause a series of operational steps to be performed on the computer, other programmable apparatus or other devices to produce a computer-implemented process, such that the instructions which execute on the computer, other programmable apparatus, or other device implement the functions/acts specified in the flowcharts, flow diagrams, state transition diagrams, pseudo-code, and the like.

In some alternative implementations, the functions noted in flowcharts, flow diagrams, state transition diagrams, pseudo-code, and the like may occur out of the order noted in the figures. For example, two blocks shown in succession in a flowchart may, in fact, be executed substantially concurrently, or the blocks may sometimes be executed in the reverse order, depending upon the functionality involved. It will also be noted that each of the functions noted in the figures and combinations of such functions can be implemented by special purpose hardware-based systems that perform the specified functions or acts or by combinations of special-purpose hardware and computer instructions.

With these fundamentals in place, some non-limiting examples to illustrate various implementations of aspects of the present disclosure are discussed next.

FIG. 1 shows an encoder 100 for a polar code. As discussed above, a polar code is a linear block code that "polarizes" the capacity of bit channels, such that their capacities either approach one (i.e., a perfect channel) or zero (a completely noisy channel). Information bits 102 in an input data are then sent via the bit channels that have capacities near one, while frozen bits 104—predetermined constant bit values—may be added by the data communication system are sent over bit channels that have a capacity near zero.

Let N and k be positive integers with k≤N. For an (N, k) block code, its input is a vector of k bits and its output is a vector of N bits. An encoder is an implementation of (N, k) block code, which may be a function in software or hardware. N is called the block size or block length.

$$\frac{k}{N}$$

may be referred to as the code rate.

An encoder 100 generally encodes input data 106 of bits, including information bits 102 and frozen bits 104, and have a total block length of N=$2^n$, where n is an integer. Each bit has a value. This may be referred to an (N, k) polar code, with k information bits (i.e., information bits 102) and N encoded bits 108, leaving (N−k) frozen bits 104. In general, an (N, k) polar code can be defined by an N×N generator matrix $G_2$, where:

$$G_2 = \begin{bmatrix} 1 & 0 \\ 1 & 1 \end{bmatrix}^{\otimes n}$$

It is to be understood that $G_2$, which is a generator matrix of 2×2 is just an example. Other generator matrices may also work, for example, a polarizing matrix of size 3×3.

In the above formulation, $[\cdot]^{\otimes n}$ denotes the n-fold Kronecker power. Where the input data 106 are denoted $u=[u_1, u_2, \ldots, u_N]^T$ and the encoded bits 108 (collectively referred to as the "codeword" x) are denoted $x=[x_1, x_2, \ldots, x_N]^T$, the codeword is given by $x=uG_2$. This operation takes place within the encoder 100.

Additionally, although the frozen bits 104 are shown in FIG. 1, for ease of illustration, as being located at the front within the input data 106, they may, in fact, be scattered throughout the input data 106, depending on the capacity of each bit channel.

It will further be understood that complete polarization of the bit channels is only achieved at the limit as $N \to \infty$. For small and mid-sized code lengths N, a polar code will produce channels having a range of capacities, which, while still generally polarized toward either 1 (i.e., a perfect channel) or 0 (i.e., a completely noisy channel), will not reach either of these limits. Thus, for real-world polar coding, the k information bits 102 should be placed in the k most reliable (i.e., highest capacity) locations in u. The N−k frozen bits 104 can be then placed in the locations in u having the lowest reliability and are assigned fixed values known to both the encoder 100 and the decoder (not shown in FIG. 1).

Figure 2:
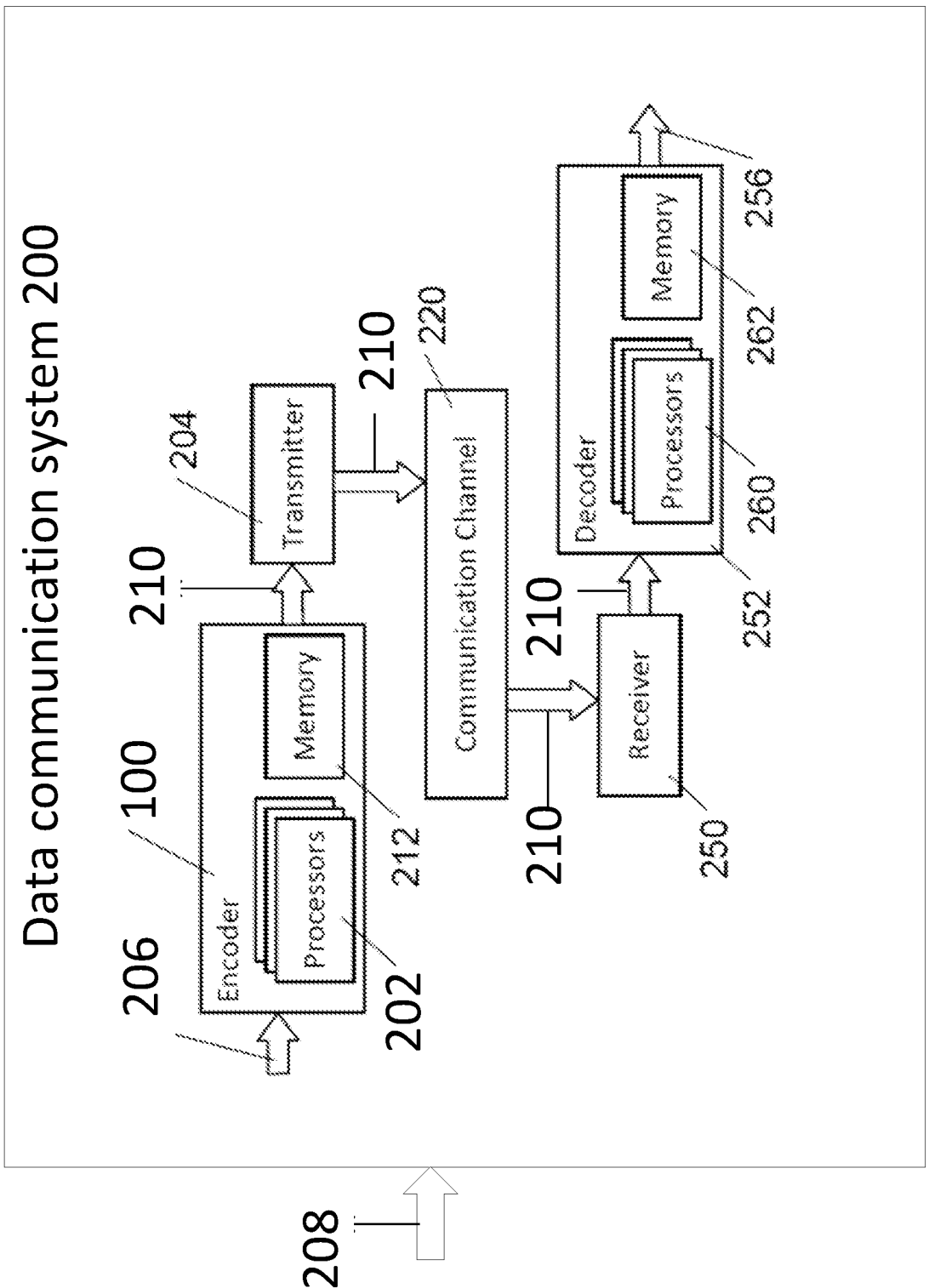
FIG. 2 shows a block diagram of a data communication system in which the technology of the present disclosure may be implemented in accordance with some example embodiments.

FIG. 2 is a block diagram of a data communication system 200 in which the technology of the present disclosure may be implemented. The data communication system includes an encoder 100 and transmitter 204, a communication channel 220, and a receiver 250 and a decoder 252.

As already discussed, the communication channel 220 may be, for example, a wireless communication channel, a cable, or an optical fiber. It will be understood that there may be noise or interference on the communication channel 220. As a result of this noise or interference, some of the bits received at the receiver 250 may have been altered during transmission, and therefore may not be the same as the bits that were transmitted over the communication channel 220 by the transmitter 204.

The data communication system 200 receives information bits 208 for a message or part of a message. The data communication system 200 adds frozen bits to the information bits to generate the input data to be provided to the encoder 100. The encoder 100 receives input data and encodes the input data according to an implementation of the disclosed technology. For instance, the encoder 100 produces codewords for transmission over the communication channel 220, and forwards the codewords to the transmitter 204 for transmission over the communication channel 220. In some implementations, the encoder 100 includes one or more processors 202 and a memory 212 that includes programmed instructions that cause the processors 202 to encode the information as described below. In some implementations, the encoder 100 receives the information bits 208 and adds the frozen bits to generate the input data 206 for encoding. It will be understood that in some implementations, the encoder 100 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to encode the information as described below. The encoder 100 generates codewords 210.

The transmitter 204 transmits the codewords 210 over the communication channel 220. Accordingly, the configuration of the transmitter 204 will depend on the nature of the communication channel 220. In general, the transmitter 204 is a conventional transmitter for the communication channel 220. Accordingly, while not shown, the transmitter 204 may include modules for post-encoding processing, as well as modules or components of a transmit chain for the communication channel 220, such as modulators, amplifiers, multiplexers, light sources (e.g., for optical communication), antennas (e.g., for wireless communication), and/or other modules or components of a conventional transmitter.

Similarly, the receiver 250 receives codewords 210 via the communication channel 220. Thus, details of the configuration of the receiver 250 will depend on the nature of the communication channel 220. The receiver 250 is a conventional receiver for the communication channel 220 and may include a variety of modules and components of a conventional receive chain (not shown), as well as components (not shown) used for any pre-decoding processing. For example, these modules and components may include antennas (e.g., for wireless communication), optical sensors or detectors (e.g., for optical communication), demodulators, amplifiers, demultiplexers, and/or other modules or components of a conventional receive chain. Codewords received by the receiver 250 are forwarded to the decoder 252.

The decoder 252 receives codewords 210 from the receiver 250 and decodes the codewords 210 according to an implementation of the disclosed technology as described below to produce received information which is provided by the decoder 252 as output data 256. The aim of the data communication system 200 is the received output data 256 be the same as the information bit 208.

In some implementations, the decoder 252 includes one or more processors 260 and a memory 262 that includes programmed instructions that cause the processors 260 to decode the information as described below. It will be understood that in some implementations, the decoder 252 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to decode the information as described below.

Figure 4:
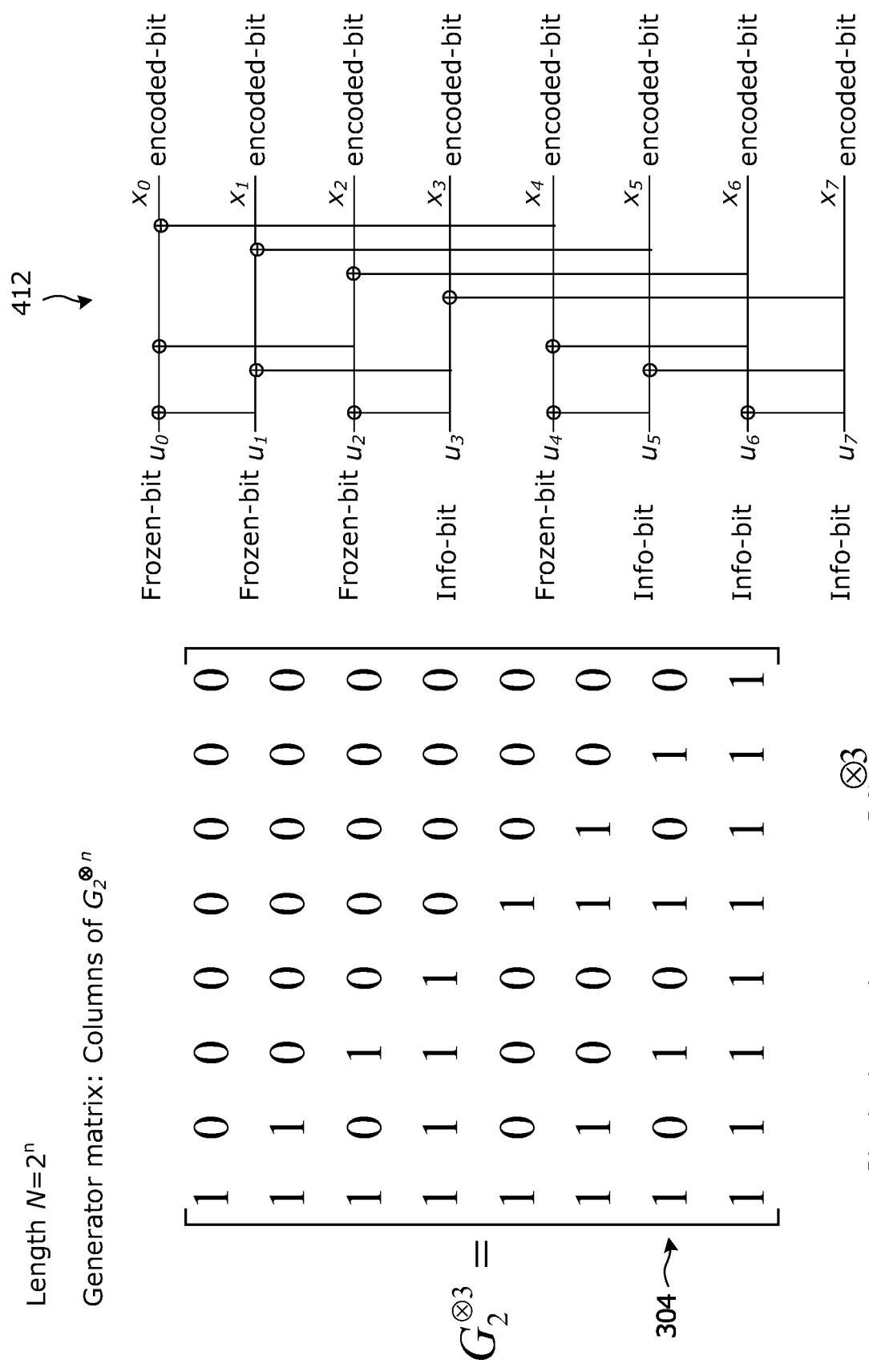
FIG. 4 illustrates an example use of a polar coding generator matrix for producing codewords and an example polar encoder in accordance with some example embodiments.
Figure 5:
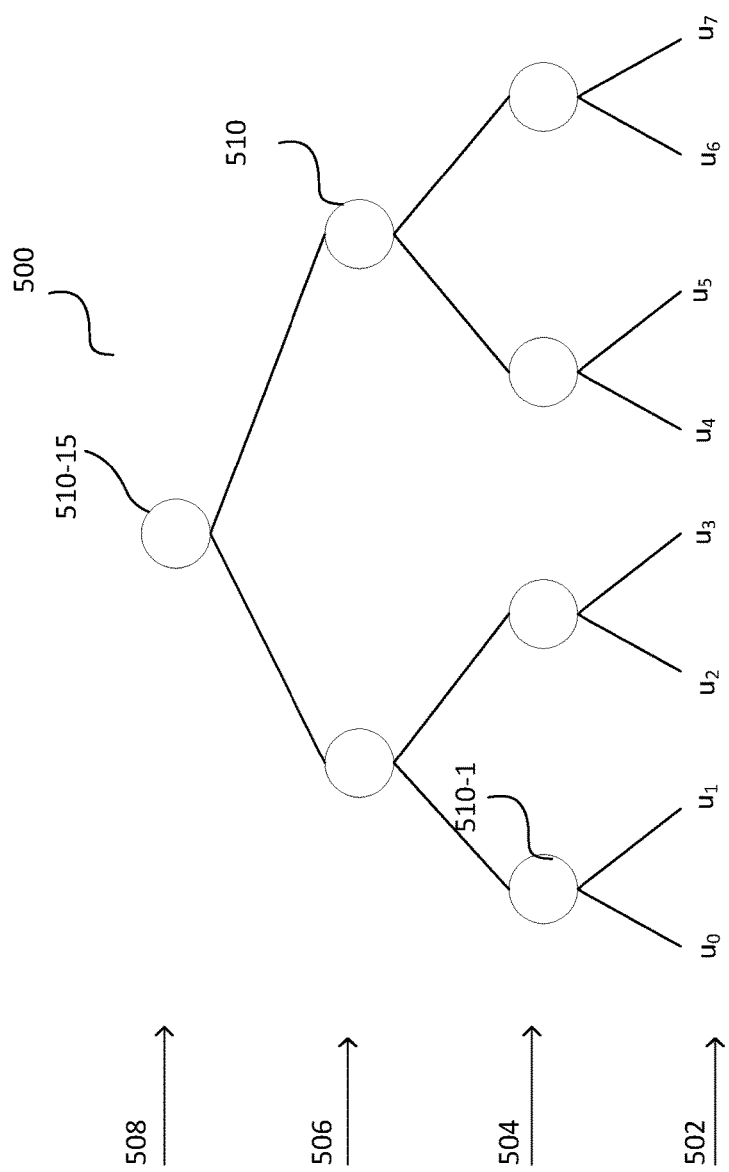
FIG. 5 illustrates an example of a polar coding encoding method represented as a binary tree in accordance with some example embodiments.

FIGS. 3, 4, and 5 are diagrams showing how the polar coding generator matrix can be produced and used in the encoder 100. The 2-fold Kronecker product matrix $G_2^{\otimes 2}$ 302 and the 3-fold Kronecker product matrix $G_2^{\otimes 3}$ 304 in FIG. 3 are examples of polar coding generator matrices. The generator matrix approach illustrated in FIG. 3 can be generalized to produce an n-fold Kronecker product matrix $G_2^{\otimes n}$.

A polar code can be formed from a Kronecker product matrix based on the kernel $G_2$ 300. For a polar code having codewords of length $N=2^n$, the generator matrix is $G_2^{\otimes 2}$.

FIG. 4 is a diagram showing an example use of a polar coding generator matrix for producing codewords and a schematic illustration of an example encoder 100. In FIG. 4, the generator matrix $G_2^{\otimes 3}$ 304 is used to produce codewords of length $2^3=8$. A codeword x is formed by the product of an input data $u=[0\ 0\ 0\ u3\ 0\ u5\ u6\ u7]$ and the generator matrix $G_2^{\otimes 3}$ 304 as indicated at 400. The input data u is composed of frozen bits (zeros) and information bits ($u_3, u_5, u_6, u_7$). In the specific example shown in FIG. 4, $N=2^3=8$, so the input data u is an 8-bit vector, and the codeword x is an 8-bit vector.

In polar code construction, the input data carries information only in the information bits, which have predefined locations in the input data. The remaining bits of the input data do not carry information and are referred to as frozen bits. The locations of the frozen bits in the input vector are known to both the encoder 100 and the decoder 252. Because the frozen bits do not carry information, in theory, the frozen bits can be set to any bit value so long as the location of the frozen bits is known to both the encoder and the decoder. Conventionally, the frozen bits are all set to 0, which may simplify computations.

In the example of FIG. 4, the input data has frozen bits in locations 0, 1, 2 and 4, and has information bits in locations 3, 5, 6, and 7. It should be understood that the locations of the frozen bits (also referred to as the frozen positions) may be different, as long as the frozen positions are known to both the encoder and the decoder. An example implementation of an encoder 100 that generates codewords 210 is indicated at 412, where the frozen bits are all set to 0, and the ⊕ symbol, not to be confused with ⊗ described above, represents modulo 2 addition or similarly known as XOR logic. For the example in FIG. 4, an N=8-bit input data is formed from k=4 information bits and N−k=4 frozen bits.

FIG. 5 explains implementing an encoder 100 that generates codewords 210 at 412 of FIG. 4 may be represented as a binary tree. The binary tree 500 has multiple levels starting at level 0 at 502, which represents the leaves. The leaves at 502 correspond to the input data $u=[u_0, u_1, \ldots, u_7]$. Apart from level 0, which is 502, every level has a plurality of nodes, one of which is labelled as 510. Each node 510 has a value traditionally determined by traversing through respective leaves from level 502 to the node. Throughout this disclosure, a hyphened node 510 (e.g., 510-1, 510-2, . . . ) refers to a specific node in FIG. 5.

Each node 510 has a value determined by the multiplication of the node's leaf values by the generator matrix, in this example $$G_2 = \begin{bmatrix} 1 & 0 \\ 1 & 1 \end{bmatrix},$$

which is technically $G_2^{\otimes 1}$, because there are two leaves, $G_2^{\otimes n}=2^n=2^1$. Node 510-1, which is at level 504, has a value of $$[u_0 \ u_1]G_2 = [u_0 \ u_1]\begin{bmatrix} 1 & 0 \\ 1 & 1 \end{bmatrix} = [u_0 + u_1 \ u_1].$$

The bits have a binary value; therefore, the addition is a module 2 addition, and each addition is an XOR operation. Consequently, as the number of bits of the input data increases, the number of XOR operations required to determine the codeword 210 increases.

Traversing the leaf values from level 502 to level 508 to determine the value of the root node 510-15 results into the codeword $x=[x_0, x_1, \ldots, x_7]$. In other words, the value of the root node 510-15 is the codeword x. It is to be understood that input data u of 8 bits in FIG. 5 is an example. Practically, u and x may be of hundreds or thousands of bits, yet the same principles explained above apply.

Some nodes 510 may have characteristics (special arrangement) allowing for a shortcut of computations instead of traversing level by level through the tree 500 to find a node's 510 value. Such nodes are special nodes and are described below in detail below.

Figure 6:
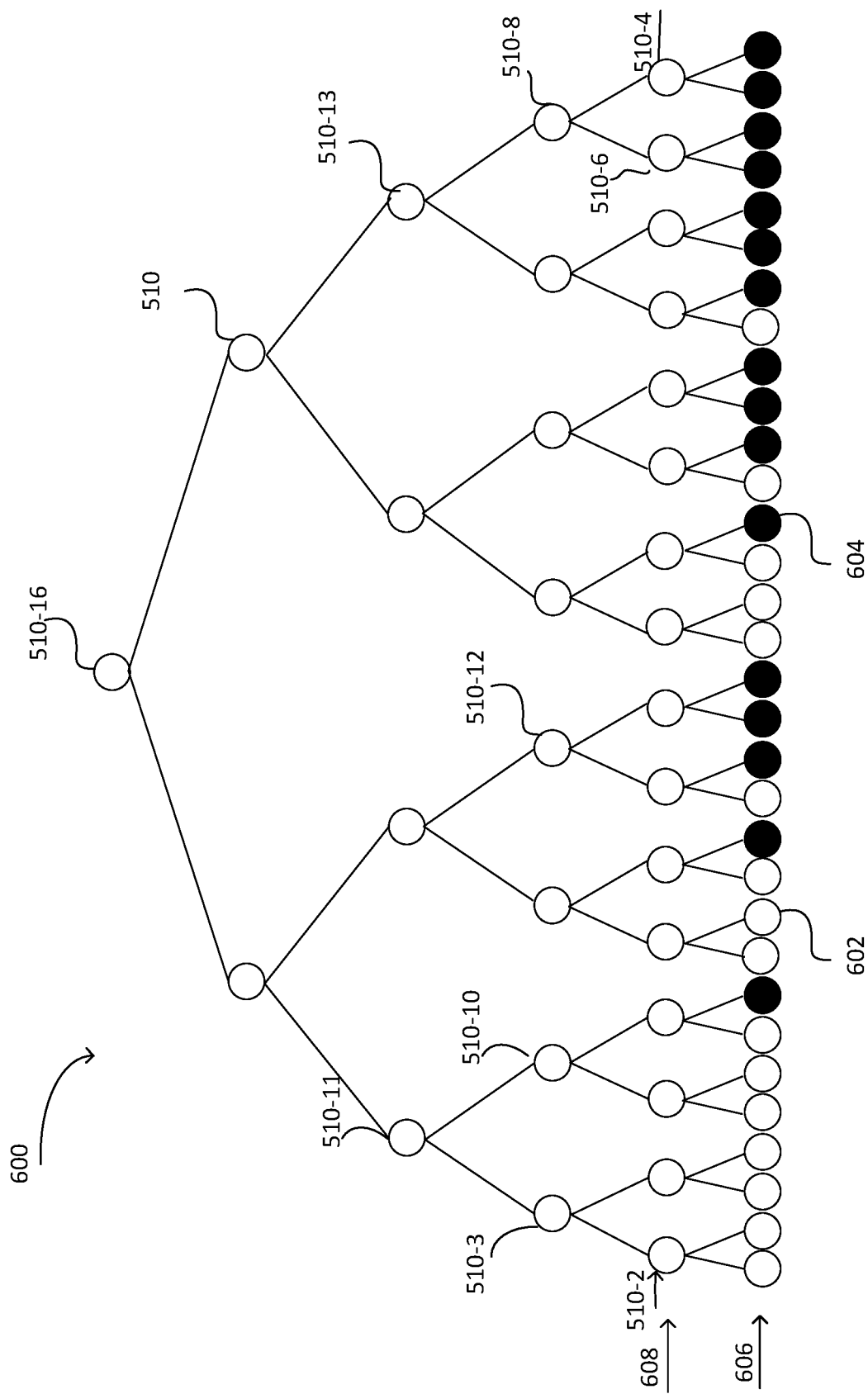
FIG. 6 shows an example binary tree illustrating various special nodes used in the encoder of polar coding in accordance with some example embodiments.

FIG. 6 is an example tree 600 to show special nodes for an encoder 100 that generates codewords 210 with input data of 32 bits. Each node of the tree of FIG. 6 is also a node 510. The white leaf representations, one of which is marked 602, at level 606 are for frozen bits, and the black leaf representations, one of which is labelled 604, are for information bits. This example embodiment, therefore, has k=16 and N=32. The first set of nodes begins at level 608, which is level 1, and every two nodes 510 (in the case of binary tree) has a parent node. The farthest node is the root node 510-16, where computing its value is the value of the codeword.

Follows are some special nodes of the present disclosure and their definitions. Special nodes are identified based on special arrangements of locations of information and frozen bits in a subset of the input data. The subset of the input data is the part of the input data corresponding to the leaves of a node at level 606. For simplicity, frozen bits are assigned a value of 0, but generally, they could be assigned any value.

Example embodiments may not strictly represent the encoding as a decision tree, as in FIG. 4. For such instances, a series of computations are performed to generate the codeword. Referring back to FIG. 4, the series of computations may include the matrix multiplication of $x=[0\ 0\ 0\ u3\ 0\ u5\ u6\ u7]G_2^{\otimes 3}$. With the use of special nodes, a fewer number of XOR operations (addition modulo 2) are performed.

The present disclosure discusses using special nodes at the encoder to encode input data. The following special nodes are examples and are not intended to be limiting. Other special nodes not disclosed herein may be equally applicable.

Rate 0

Rate 0 special nodes are nodes 510 with node's input data containing frozen bits only. The node's input data is a subset of the input data corresponding to the leaf values of the special node at level 606. A rate 0 special node value is determined by multiplying the leaf values of the special node at level 606 by a generator matrix, the result of which is a zero vector of the same length as the number of leaf values of the special node. In other words, if a rate 0 special node has L leaves at level 606, each leaf value is $u_k$, where $0 \leq k \leq L-1$, k is an integer, then $[u_i, u_{i+1}, u_{i+2}, \ldots, u_{i+L-1}]G_2^{\otimes \log_2 L}=[0, 0, 0, \ldots, 0]_{1 \times L}G_2^{\otimes \log_2 L}=[0, 0, 0, \ldots, 0]_{1 \times L}$. Therefore, when an encoder 100 identifies a rate 0 special node, no XOR operations are performed, and the encoder 100 assigns a value of $[0, 0, 0, \ldots, 0]_{1 \times L}$ to the rate 0 special node.

Node 510-2 is a rate 0 special node with leaf values of [0, 0]. Node 510-3 is also a rate 0 special node since the leaves of descendent nodes at level 606 are frozen bits.

A rate 0 special node does not carry information bits. Determining the node's value directly without traversing through the nodes saves $$\frac{L}{2}\log_2 L \times OR$$

operations.

Rate 1

Rate 1 special node is a node 510 with node's input data containing information bits only. For this special node, if a rate 1 special node has L leaves at level 606, each leaf value $u_k$ is for an information bit, where $0 \leq k \leq L-1$, k is an integer, then the value of the rate 1 special node $[u_i, u_{i+1}, u_{i+2}, \ldots, u_{i+L-1}]G_2^{\otimes \log_2 L} = [c_i, c_{i+i}, \ldots, c_{i+L-1}]$, where $[c_i, c_{i+1}, \ldots, c_{i+L-1}]$ is a linear transformation of $[u_i, u_{i+1}, u_{i+2}, \ldots, u_{i+L-1}]$. This operation is equivalent to having no codeword. Therefore, when encoder 100 identifies a rate 1 special node, no XOR computations are performed, and the encoder 100 assigns the value of the rate 1 special node with values of the respective information bits i.e. $[c_i, c_{i+1}, \ldots, c_{i+L-1}] = [u_i, u_{i+1}, u_{i+2}, \ldots, u_{i+L-1}]$.

To label a few nodes in FIG. 6, node 510-4 and node 510-6 are rate 1 special nodes. For those nodes, the encoder 100 does not perform XOR computations; instead, encoder 100 uses the value of the respective node's input data. Similarly, node 510-8 is also a rate 1 special node. The saving in XOR operations when determining the value of the rate 1 special node directly instead of traversing through the nodes is $$\frac{L}{2}\log_2 L.$$

REP

REP special node is a node 510 with node's input data containing one information bit, and the other bits are frozen bits. For this special node, if a REP special node has L leaves at level 606, each leaf value $u_k$ is for an information bit, where $0 \leq k \leq L-1$, k is an integer, then the value of the REP special node $[0, 0, \ldots, 0, u_{i+L-1}]G_2^{\otimes \log_2 L} = [u_{i+L-1}, u_{i+L-1}, \ldots, u_{i+L-1}]$. Therefore, the value of the REP special node is the value of the information bit repeated L times. In some example embodiments, the location of the information bit is not at location i+L-1, yet the same rule applies. Therefore, when encoder 100 identifies a REP special node, no XOR computations are performed when determining the value of the REP special node. Nodes 510-10 and 510-11 in FIG. 6 are examples of REP special nodes. The saving in XOR operations when determining the value of an REP special node directly instead of traversing through the nodes is $$\frac{L}{2}\log_2 L.$$

SPC

SPC special node is a node 510 with node's input data containing one frozen bit at the left-most bit, also known as the most significant bit, and the other bits are information bits. For this special node, if a SPC special node has L leaves at level 606, each leaf value $u_k$ is for an information bit, where $0 \leq k \leq L-1$, k is an integer, then the value of the SPC special node may be determined through $[0, u_{i+1}, u_{i+2}, \ldots, u_{i+L-1}]G_2^{\otimes \log_2 L} = [c_i, c_{i+1}, \ldots, c_{i+L-1}]$. A person skilled in the art would understand and can prove that $\text{xcor}([c_i, c_{i+1}, \ldots, c_{i+L-1}]) = 0$. For this special node, when the encoder 100 identifies a SPC special node, the encoder 100 assigns L-1 information bits into L-1 of $[c_i, c_{i+1}, \ldots, c_{i+L-1}]$. Further, the encoder 100 computes the XOR operation of all L-1 bits and assigns the value of which to the $L^{th}$ bit of $[c_i, c_{i+1}, \ldots, c_{i+L-1}]$. In some example embodiments, the sequence of which L-1 information bits are assigned to which $c_k$ is arbitrary, where $0 \leq k \leq L-1$, k is an integer.

The nodes 510-12 and 510-13 are examples of SPC nodes. The saving in XOR operations when determining the value of an SPC special node directly instead of traversing through the nodes $$\frac{L}{2}\log_2 L - (L-1).$$

Type I

Type I special node is a node 510 with node's input data containing two information bits at the two right-most bits, and the other bits are frozen bits. For this special node, if a type I special node has L leaves at level 606, each leaf value $u_k$ is for an information bit, where $0 \leq k \leq L-1$, k is an integer, then the value of the type I special node may be determined through $[0, 0, 0, \ldots u_{i+L-2}, u_{i+L-1}]G_2^{\otimes \log_2 L} = [u_{i+L-2}, u_{i+L-1}, u_{i+L-2}, u_{i+L-1}, \ldots]$. Therefore, when the encoder 100 identifies a type I special node, the encoder 100 assigns the L bit output of the type I special node as the two information bits $u_{i+L-2}$ and $u_{i+L-1}$ each repeated L/2 times.

The saving in XOR operations when determining the value of a type I special node directly instead of traversing through the nodes $$\frac{L}{2}\log_2 L.$$

Type II

Type II special node is a node 510 with node's input data containing three information bits at the three right-most bits, and the other bits are frozen bits. It is clear to a person skilled in the art that the length of this node's input data is more than 4 bits. For this special node, if a type II special node has L leaves at level 606, each leaf value $u_k$ is for an information bit, where $0 \leq k \leq L-1$, k is an integer, then the value of the type II special node may be determined through $[0, \ldots, 0, u_{i+L-3}, u_{i+L-2}, u_{i+L-1}]G_2^{\otimes \log_2 L} = [u_{i+L-3}, u_{i+L-2}, u_{i+L-1}, u_{i+L-3}+u_{i+L-1}, u_{i+L-2}+u_{i+L-1}, u_{i+L-1}, u_{i+L-3}+u_{i+L-2}+u_{i+L-1}, u_{i+L-3}+u_{i+L-1}, u_{i+L-2}+u_{i+L-1}, u_{i+L-1}, \ldots]$.

It can be realized that:

The zeroth, fourth, and eighth index and so on of the value of the type II special node have the same information bit value of $u_{i+L-2}+u_{i+L-1}+u_{i+L}$.

The first, fifth, ninth index so on of the value of the type II special node have the same information bit value of $u_{i+L-2}+u_{i+L}$.

The second, sixth, tenth index and so on of the value of the type II special node have the same information bit value of $u_{i+L-1}+u_{i+L}$.

The third, seventh, eleventh and so on of the value of the type II special node have the same information bit value of $u_{i+L}$.

Therefore, X or$([u_{i+L-2}+u_{i+L-1}+u_{i+L}, u_{i+L-2}+u_{i+L} \cdot u_{i+L-1}+u_{i+L}])=0$ When the encoder 100 identifies a type II special node, the encoder 100 uses three information bits, e.g. $v_1$, $v_2$, and $v_3$ to determine the value of type II special node. In particular, the encoder 100, instead of computing $[0, \ldots, 0, u_{i+L-3}, u_{i+L-2}, u_{i+L-1}]G_2^{\otimes \log_2 L}$, it assigns The zeroth, fourth, and eighth index and so on of the value of the type II special node with a value of v1.

The first, fifth, ninth index so on of the value of the type II special node with a value of v2.

The second, sixth, tenth index and so on of the value of the type II special node with a value of v3.

The third, seventh, eleventh and so on of the value of the type II special node with a value of $v1+v_2+v_3$.

Therefore, the value of the type II special node may be determined as $[v_1, v_2, v_3, v_1+v_2+v_3, v_1, v_2, v_3, v_1+v_2+v_3, \ldots v_1, v_2, v_3, v_1+v_2+v_3]$.

The saving in XOR operations when determining the value of a type II special node directly instead of traversing through the nodes is $$\frac{L}{2}\log_2 L - 3.$$

Type III

Type III special node is a node 510 with node's input data containing two frozen bits at the two left-most bits, and the other bits are for information bits. For this special node, if a type II special node has L leaves at level 606, each leaf value $u_k$ is for an information bit, where $0 \leq k \leq L-1$, k is an integer, then the value of the type II special node may be determined through $[0, 0, u_{i+2}, u_{i+3}, \ldots, u_{i+L-1}]$ $G_2^{\otimes \log_2 L} = [c_0, c_1, c_3, \ldots c_{L-1}]$. The result of xcor $(c_1, c_3, c_5, \ldots) = 0$ and the result of $\text{xcor}(c_2, c_4, c_6, \ldots) = 0$. Therefore, when the encoder 100 identifies a type III special node, the encoder 100 divides the L−2 information bits into two groups, and computes a parity check bit for each group. Afterwards, the encoder 100 determines the value of the type III node as the L−2 information bits and the two parity check bits.

The saving in XOR operations when determining the value of a type III special node directly instead of traversing through the nodes is $$\frac{L}{2}\log_2 L - (L-2).$$

In some example embodiments, some nodes may be identified as more than one special node, for example, node 510-12 can be identified as an SPC special node and a type II node. The encoder 100 would identify the special node as the one requiring fewer XOR computations.

In some example embodiments, there is a node that is a special node but has an ancestor node that is also a special node. For example, special node 510-2 has a parent node 510-3, which is a special node, and a grandparent node 510-11 which is also a special node. The encoder 100 may determine the value of the farthest ancestor. Therefore, the value of node 510-11 could be computed directly without computing the value of nodes 510-2 and 510-3.

Figure 7:
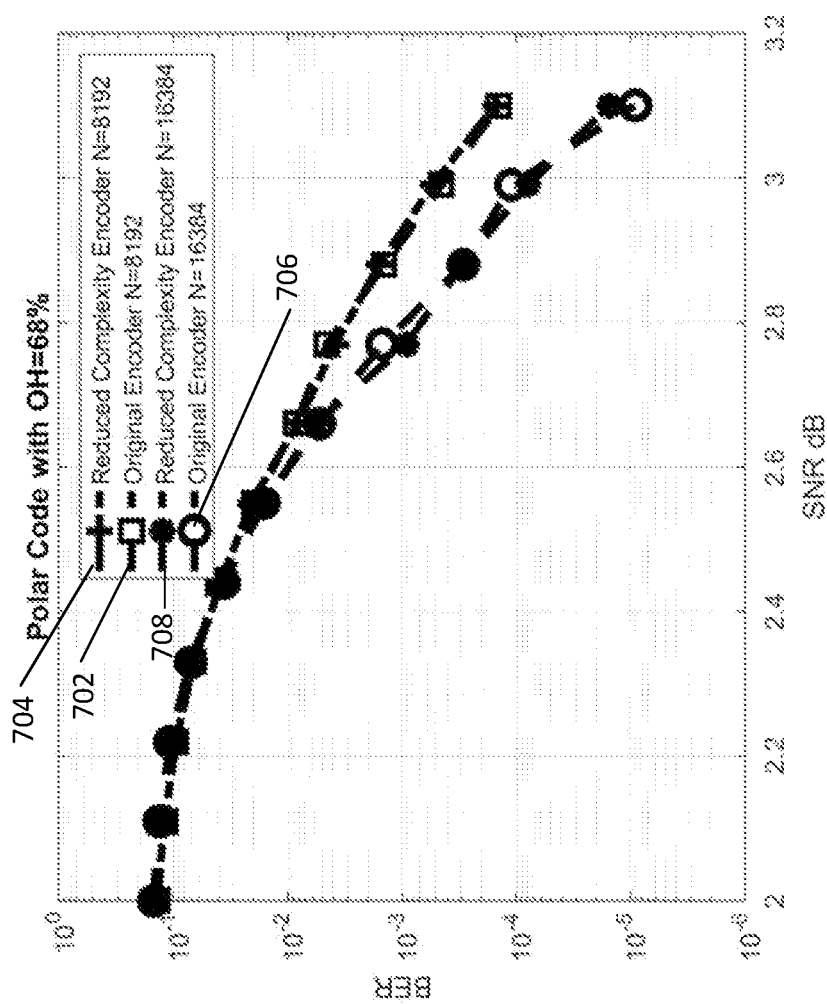
FIG. 7 shows simulation results for encoding information bits in accordance with some example embodiments.

FIG. 7 is a graph of simulation results comparing the performance of four data communication systems. Two data communication systems implement an encoder with the technology of the present disclosure, i.e. performing computations utilizing special nodes, while the other data communication systems use the original encoder that does not make use of the special nodes. The original encoder may be the one introduced in E. Arikan, "Channel Polarization: A Method for Constructing Capacity Achieving Codes for Symmetric Binary-Input Memoryless Channels," IEEE Trans. Inf. Theory, vol. 55, no. 7, pp. 3051-3073 (July 2009). FIG. 7 compares the bit error rate (BER) to signal-to-noise ratio (SNR). Therefore, it compares the performance of a data communication system for different levels of channel noise.

Plot 702 is the simulation for a data communication system with input data of N=8,192 bits; this data communication system does not implement an encoder with the technology of the present disclosure. Plot 702 is the simulation for a data communication system with input data of N=8,192 bit; this communication system uses the technology of the present disclosure. It can be observed that plots 702 and 704 are almost identical; however, the data communication system that generated graph 702 required 53,248 XOR operations while the data communication system that generated plot 704 required 28,304 XOR operations. Hence, there is a reduction of about 53% in the number of XOR operations performed when the technology of the present disclosure is used.

Similarly, plot 706 simulates results for a data communication system with input data of N=16,384; this communication system does not implement an encoder with the technology of the present disclosure (original encoder). Plot 708 simulates results for a data communication system with input data of N=16,384; this data communication system implements the technology of the present disclosure. Plots 706 and 708 are almost identical, indicating that both data communication systems have almost identical performance. However, the data communication system that generated plot 706 required 140,688 XOR operations. On the other hand, the data communication system that generated plot 708 required 60,500 XOR operations. That's a reduction of 52% over the data communication system using the original encoder.

Figure 8:
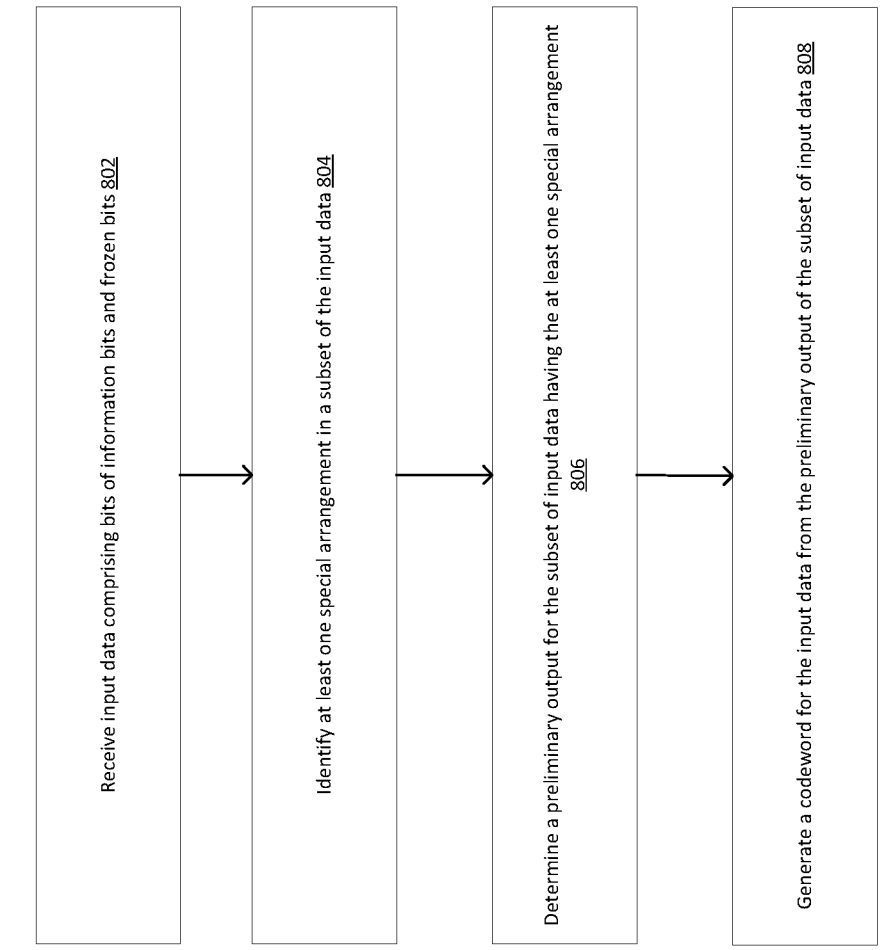
FIG. 8 is a flowchart of the encoding method for polar coding in accordance with some example embodiments.

FIG. 8 is a flowchart of a method 800 for encoding information bits to generate codewords for transmission across a communication channel. The method 800 begins at step 802 where the encoder 100 receives input data comprising bits of information bits and frozen bits. The method then proceeds to step 804. At step 804, the method identifies at least one special arrangement in a subset of input data depending on the locations of the information bits and the frozen bits. This subset of input data is of length L. Step 804 ends, and step 806 begins. At step 806, method 800 determines a preliminary output for the subset of input data having the at least one special arrangement. Step 806 ends, and step 808 begins. At step 808, the method generates a codeword for the input data from the preliminary output of the subset of input data.

It will be understood that, although the embodiments presented herein have been described with reference to specific features and structures, various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

The invention claimed is:

1. A method for encoding information bits to generate codewords for transmission across a communication channel, the method comprising:

receiving input data comprising the information bits and frozen bits, each bit having a value;

dividing the input data into a plurality of bit subsets each having a length of L bits;

identifying each bit subset as belonging either to a default subset arrangement or to a respective one of a plurality of special subset arrangements depending on locations of information bits and frozen bits in the bit subset;

when a bit subset is identified as belonging to the default subset arrangement, assigning a respective default node output by applying a default node operation that comprises of a series of computations to determine the default node output;

when a bit subset is identified as belonging to a respective one of the plurality of special subset arrangements, assigning a respective special node output by applying a special node operation that corresponds to the respective special subset arrangement that the bit subset has been identified as belonging to; and generating a codeword for the input data based on the default and special node outputs;

wherein the special node operations each respectively require fewer computations than the series of computations of the default node operation.

2. The method of claim 1, wherein the method processes the input data using a multi-level node arrangement including a layer of input level nodes, one or more layers of intermediate nodes, and an output layer comprising an root node for outputting the codeword, each intermediate node being connected to a respective set of nodes from a preceding layer to process the node outputs thereof; the root node being connected to a set of intermediate nodes from a final layer of the intermediate nodes, wherein each bit subset is provided as input to a respective one of the input level nodes, wherein the nodes include special nodes for performing the special node operations and default nodes for performing the default node operations.

3. The method of claim 2, wherein the plurality of special subset arrangements include at least two of:

Rate 0: wherein all bits of the bit subset are frozen bits;

Rate 1: wherein all bits of the bit subset are information bits;

SPC: wherein a most-left bit of the bit subset is a frozen bit and the other bits of the bit subset are information bits;

Type I: wherein two right-most bits of the bit subset are information bits and the other bits of the bit subset are frozen bits;

Type II: wherein three right-most bits of the bit subset are information bits and the other bits of the bit subset are frozen bits; and Type III: wherein two most-left bits of the bit subset are frozen bits and the other bits of the bit subset are information bits.

4. The method of claim 3, wherein:

when a bit subset is identified as belonging to Rate 0, the assigned respective special node output comprises L bits of zero values;

when a bit subset is identified as belonging to Rate 1, the assigned respective special node output comprises L number of bits of information bits;

when a bit subset is identified as belonging to SPC, the assigned respective special node output comprises L number of bits, L–1 bits of the L bits being information bits and one bit being an XOR operation of the L–1 bits of the information bits;

when a bit subset is identified as belonging to Type I, the assigned respective special node output comprises L number of bits, the L bits being two information bits repeated alternatively;

when a bit subset is identified as belonging to Type II, the assigned respective special node output comprises L number of bits, the bits being:

three information bits repeated, every repetition being a first information bit, a second information bit, a third information bit, and a module 2 addition of the first information bit, the second information bit, and the third information bit; and when a bit subset is identified as belonging to Type III, the assigned respective special node output comprises L number of bits, wherein L–2 bits are information bits, the L–2 bits that are information bits being divided into two groups and a parity check bit being computed for each group, wherein the two parity check bits are two other bits of the L bits.

5. The method of claim 2, wherein when a bit subset is identified as belonging to the default subset arrangement, applying the default node operation comprises multiplying values of the bit subset by a generator matrix.

6. The method of claim 5, wherein the generator matrix is $G_2^{\otimes \log_2 L}$, provided that $$G_2 = \begin{bmatrix} 1 & 0 \\ 1 & 1 \end{bmatrix}.$$

7. The method of claim 1, wherein the frozen bits have a value of zero.

8. An encoder that encodes information bits to generate codewords for transmission across a communication channel, the encoder comprising circuitry configured to:

receive input data comprising bits of the information bits and frozen bits, each bit having a value;

divide the input data into a plurality of bit subsets each having a length of L bits;

identify each bit subset as belonging either to a default subset arrangement or to a respective one of a plurality of special subset arrangements depending on locations of information bits and frozen bits in the bit subset;

when a bit subset is identified as belonging to the default subset arrangement, assign a respective default node output by applying a default node operation that comprises of a series of computations to determine the default node output;

when a bit subset is identified as belonging to a respective one of the plurality of special subset arrangements, assign a respective special node output by applying a special node operation that corresponds to the respective special subset arrangement that the bit subset has been identified as belonging to; and generate a codeword for the input data from the preliminary based on the default and special node outputs;

wherein the special node operations each respectively require fewer computations than the series of computations of the default node operation.

9. The encoder of claim 8, wherein the input data is processed using a multi-level node arrangement including a layer of input level nodes, one or more layers of intermediate nodes, and an output layer comprising an root node for outputting the codeword, each intermediate node being connected to a respective set of nodes from a preceding layer to process the node outputs thereof; the root node being connected to a set of intermediate nodes from a final layer of the intermediate nodes, wherein each bit subset is provided as input to a respective one of the input level nodes, wherein the nodes include special nodes for performing the special node operations and default nodes for performing the default node operations.

10. The encoder of claim 9, wherein the plurality of special subset arrangements include at least two of:
Rate 0: wherein all bits of the bit subset are frozen bits;
Rate 1: wherein all bits of the bit subset are information bits;
SPC: wherein a most-left bit of the bit subset is a frozen bit and the other bits of the bit subset are information bits;
Type I: wherein two right-most bits of the bit subset are information bits and the other bits of the bit subset are frozen bits;
Type II: wherein three right-most bits of the bit subset are information bits and the other bits of the bit subset are frozen bits; and
Type III: wherein two most-left bits of the bit subset are frozen bits and the other bits of the bit subset are information bits.

11. The encoder of claim 10, wherein:
when a bit subset is identified as belonging to Rate 0, the assigned respective special node output comprises L bits of zero values;
when a bit subset is identified as belonging to Rate 1, the assigned respective special node output comprises L number of bits of information bits;
when a bit subset is identified as belonging to SPC, the assigned respective special node output comprises L number of bits, L−1 bits of the L bits being information bits and one bit being an XOR operation of the L−1 bits of the information bits;
when a bit subset is identified as belonging to Type I, the assigned respective special node output comprises L number of bits, the L bits being two information bits repeated alternatively;
when a bit subset is identified as belonging to Type II, the assigned respective special node output comprises L number of bits, the bits being:
three information bits repeated, every repetition being a first information bit, a second information bit, a third information bit, and a module 2 addition of the first information bit, the second information bit, and the third information bit; and
when a bit subset is identified as belonging to Type III, the assigned respective special node output comprises L number of bits, wherein L−2 bits are information bits, the L−2 bits that are information bits being divided into two groups and a parity check bit being computed for each group, wherein the two parity check bits are two other bits of the L bits.

12. The encoder of claim 9, wherein when a bit subset is identified as belonging to the default subset arrangement, applying the default node operation comprises multiplying values of the bit subset by a generator matrix.

13. The encoder of claim 12, wherein the generator matrix is $G_2^{\otimes \log_2 L}$, provided that $$G_2 = \begin{bmatrix} 1 & 0 \\ 1 & 1 \end{bmatrix}.$$

14. The encoder of claim 8, wherein the frozen bits have a value of zero.

* * * * *

UNITED STATES PATENT AND TRADEMARK OFFICE
CERTIFICATE OF CORRECTION

PATENT NO.        : 11,791,844 B2
APPLICATION NO.   : 17/559262
DATED             : October 17, 2023
INVENTOR(S)       : Hamid Ebrahimzad and Zhuhong Zhang It is certified that error appears in the above-identified patent and that said Letters Patent is hereby corrected as shown below:

In the Claims

Column 18, Lines 48-49:
"generate a codeword for the input data from the preliminary based on the default and special node outputs;"

Should read:
-- generate a codeword for the input data based on the default and special node outputs; --

Signed and Sealed this
Nineteenth Day of December, 2023

Katherine Kelly Vidal
*Director of the United States Patent and Trademark Office*